United States Patent

Shiomi et al.

[11] Patent Number: 6,136,093
[45] Date of Patent: Oct. 24, 2000

[54] METHOD OF MAKING GAN SINGLE CRYSTAL AND APPARATUS FOR MAKING GAN SINGLE CRYSTAL

[75] Inventors: Hiromu Shiomi, Itami; Masami Tatsumi, Osaka; Shigehiro Nishino, 32, Fukakusa Sekiyashiki-cho, Fushimi-ku, Kyoto-shi, Kyoto 612-0037, all of Japan

[73] Assignees: Sumitomo Electric Industries, Ltd., Osaka; Shigehiro Nishino, Kyoto, both of Japan

[21] Appl. No.: 09/235,632

[22] Filed: Jan. 22, 1999

[30] Foreign Application Priority Data

Jan. 26, 1998 [JP] Japan .................................. 10-012645

[51] Int. Cl.[7] .................................................. C30B 25/16
[52] U.S. Cl. .............................. 117/104; 117/84; 117/89; 117/952
[58] Field of Search .................................. 117/13, 84, 89, 117/93, 102, 104, 952

[56] References Cited

U.S. PATENT DOCUMENTS 5,637,531  6/1997  Porowski et al. .......................... 117/89
5,976,398  11/1999  Yagi .................................. 252/62.36 A

OTHER PUBLICATIONS

Nakamura, S. *GaN Growth Using GaN Buffer Layer*, Japanese Journal of Applied Physics, vol. 30, No. 10A, Oct. 1991, pp. L1705–L1707.

*Primary Examiner*—Felisa Hiteshew
*Attorney, Agent, or Firm*—Smith, Gambrell & Russell, LLP

[57] ABSTRACT

An apparatus comprises a Ga-disposing section in which Ga is disposed; a seed-crystal-disposing section in which a seed crystal of GaN is disposed; a synthesis vessel adapted to accommodate the Ga-disposing section, the seed-crystal-disposing section, and a gas containing nitrogen; heating means adapted to heat the Ga-disposing section and the seed-crystal-disposing section; and a control section for transmitting to the heating means a command for heating the Ga to an evaporation temperature of Ga or higher and heating the seed crystal to a temperature higher than that of the Ga, wherein the Ga evaporated by the heating means is adapted to react with the nitrogen of a nitrogen component in the gas so as to yield a GaN-forming gas, the GaN-forming gas being adapted to reach the seed-crystal-disposing section.

10 Claims, 2 Drawing Sheets

METHOD OF MAKING GAN SINGLE CRYSTAL AND APPARATUS FOR MAKING GAN SINGLE CRYSTAL

BACKGROUND OF THE INVENTION

1. Field of the Invention

The present invention relates to a method of making a GaN single crystal and apparatus for making a GaN single crystal in which high-quality GaN suitable for semiconductor electronic components is grown.

2. Related Background Art

In recent years, attention has been paid to GaN as a semiconductor material which can emit blue and ultraviolet rays. Conventionally employed as a method of forming an epitaxial film of GaN single crystal is an epitaxial method such as MOCVD method using an organic metal and ammonia as its Ga source and nitrogen, respectively.

SUMMARY OF THE INVENTION

As described in Nakamura, S., Jp. j. Appl. Phys. Vo. 360L1705 (1991), however, the MOCVD method may be problematic in that the growth rate is only several $\mu$m/h, whereby the GaN single crystal grows very slowly. If the temperature of the substrate is raised in order to enhance the growth rate, then the Ga source supplied by the organic metal will decompose in a vapor phase so as to be exhausted, thereby eventually determining the Ga supplying rate.

Also, a high-quality epitaxial film has been required for GaN to be used as a semiconductor material, thus making it necessary for the inventors to make a GaN single crystal having a higher quality than that conventionally obtained.

In view of such circumstances, it is an object of the present invention to provide a method of making a GaN single crystal and an apparatus for making a GaN single crystal in which a high-quality GaN single crystal can be obtained at a high growth rate.

The method of making a GaN single crystal in accordance with the present invention comprises a disposing step of, in a gas containing a nitrogen atom, disposing Ga in a first temperature area $T_1$ and disposing a seed crystal of GaN in a second temperature area $T_2$ that is higher than said first temperature area $T_1$; a Ga-evaporating step of evaporating the Ga from the first temperature area $T_1$; a GaN-forming-gas-generating step of generating a GaN-forming gas by reacting thus evaporated Ga and a nitrogen component in the nitrogen-containing gas; and a single-crystal-forming step of causing the GaN-forming gas to reach the seed crystal so as to form the GaN single crystal.

First, in the method of making a GaN single crystal in accordance with the present invention, Ga is evaporated as being heated by the first temperature area $T_1$. Here, as the temperature of the first temperature area $T_1$ is regulated, the partial pressure of Ga can be adjusted.

Subsequently, thus evaporated Ga is reacted with a nitrogen component in a gas, whereby a GaN-forming gas is generated. As the GaN-forming gas reaches the seed crystal of GaN, the GaN single crystal is formed. Here, as the seed crystal, a GaN single crystal substrate may also be used.

Here, the partial pressure of Ga can be adjusted by regulating the temperature of the first temperature area $T_1$ as mentioned above, and the partial pressure of nitrogen can be made substantially identical to the partial pressure of Ga by regulating the amount of supply of the nitrogen-containing gas, whereby a GaN single crystal substrate having a high quality can be obtained.

By using a liquid or a solid source of Ga, the present invention lowers the partial pressure of hydrogen in the atmosphere, thereby eliminating the problem of the GaN single crystal being etched. Also, since no organic metal is used as the Ga source, the carbon concentration in the film can be lowered. Further, since no unstable organic metal is used, there would be no problems of particles caused by decomposition of the organic metal in the vapor phase, whereby a sufficient Ga source can be supplied. As a consequence, the above-mentioned problem of determining the Ga supply rate in the MOCVD method can be solved, whereby high-speed growth is enabled.

Preferably, in the present invention, a shield made of a member selected from the group consisting of carbon, a high-melting metal, quartz, and GaN is disposed at a boundary between Ga in a liquid phase and Ga in a vapor phase in the first temperature area $T_1$, so as to control the vapor pressure of Ga. Here, as carbon, glass-like carbon (glassy carbon) is suitable in particular, which forms an excellent shield without reacting with Ga even at a high temperature.

Preferably, in the single-crystal-forming step, the seed crystal is rotated at 100 rpm or over. Thus rotating the seed crystal at a high speed can minimize the film thickness distribution and enables higher-speed growth. It is due to the fact that the rotation would thin the diffusion layer of the substrate surface, thereby increasing the driving force for diffusion.

Preferably, an argon gas or a nitrogen gas is used as a carrier gas of the Ga evaporated from the first temperature area $T_1$. Using the argon gas or nitrogen gas as the carrier gas can prevent by-products from being generated.

The apparatus for making a GaN single crystal in accordance with the present invention comprises a Ga-disposing section in which Ga is disposed; a seed-crystal-disposing section in which a seed crystal of GaN is disposed; a synthesis vessel adapted to accommodate the Ga-disposing section, the seed-crystal-disposing section, and a gas containing nitrogen; heating means adapted to heat the Ga-disposing section and the seed-crystal-disposing section; and a control section for transmitting to the heating means a command for heating the Ga to an evaporation temperature of Ga or higher and heating the seed crystal to a temperature higher than that of the Ga, wherein the Ga evaporated by the heating means is adapted to react with the nitrogen of a nitrogen component in the gas so as to yield a GaN-forming gas, the GaN-forming gas being adapted to reach the seed-crystal-disposing section.

In the apparatus for making a GaN single crystal in accordance with the present invention, Ga is evaporated by the heating means receiving the command from the control section. Here, as the heating temperature of Ga is regulated, the partial pressure of Ga can be adjusted. Subsequently, thus evaporated Ga is reacted with nitrogen, whereby a GaN-forming gas is generated. Then, as the GaN-forming gas reaches the seed crystal disposed in the seed-crystal-disposing section, the GaN single crystal is formed.

Here, the partial pressure of Ga can be adjusted by regulating the temperature of the Ga-disposing section, and the partial pressure of nitrogen can be made substantially identical to the partial pressure of Ga by regulating the amount of supply of the nitrogen-containing gas into the synthesis vessel, whereby a high-quality GaN single crystal can be obtained.

By using a liquid or a solid source of Ga, the present invention lowers the partial pressure of hydrogen in the atmosphere, thereby eliminating the problem of the GaN single crystal being etched. Also, since no organic metal is used as the Ga source, the carbon concentration in the film can be lowered. Further, since no unstable organic metal is used, there would be no problems of particles caused by decomposition of the organic metal in the vapor phase, whereby a sufficient Ga source can be supplied. As a consequence, the above-mentioned problem of determining the Ga supply rate in the MOCVD method can be solved, whereby the GaN single crystal can be grown at a high speed.

Preferably, in the apparatus for making a GaN single crystal in accordance with the present invention, an inner face of the synthesis vessel is formed from amorphous carbon. This can suppress natural nucleation in the inner face of the synthesis vessel, thus allowing a high-quality GaN single crystal to be synthesized.

Preferably, a heat shield made of graphite is disposed outside the synthesis vessel. This can suppress the heat dissipation caused by heat radiation.

Preferably, the heat shield is made of a plurality of rectangular graphite sheets disposed close to each other with a gap therebetween, such as to yield substantially a cylindrical form as a whole. This can suppress the induced current caused by high-frequency heating. Further, if a plurality of such heat shields are disposed radially of the synthesis vessel, then the heat dissipation and induced current can further be suppressed.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

In the following, a preferred embodiment of the method of making a GaN single crystal and apparatus for making a GaN single crystal in accordance with the present invention will be explained in detail.

Figure 1:
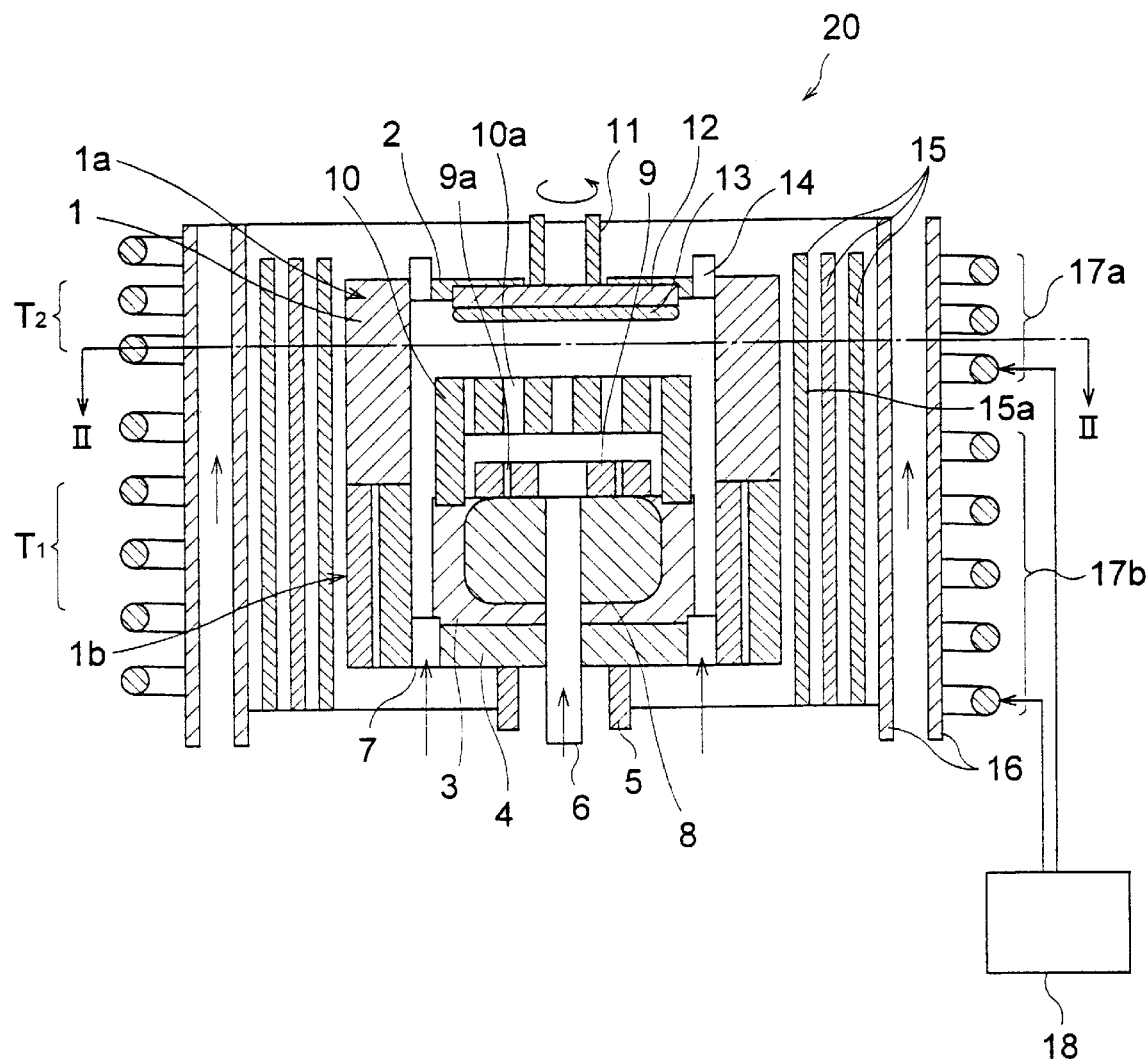
FIG. 1 is a schematic configurational view showing an apparatus for making a GaN single crystal in accordance with the present invention.
Figure 2:
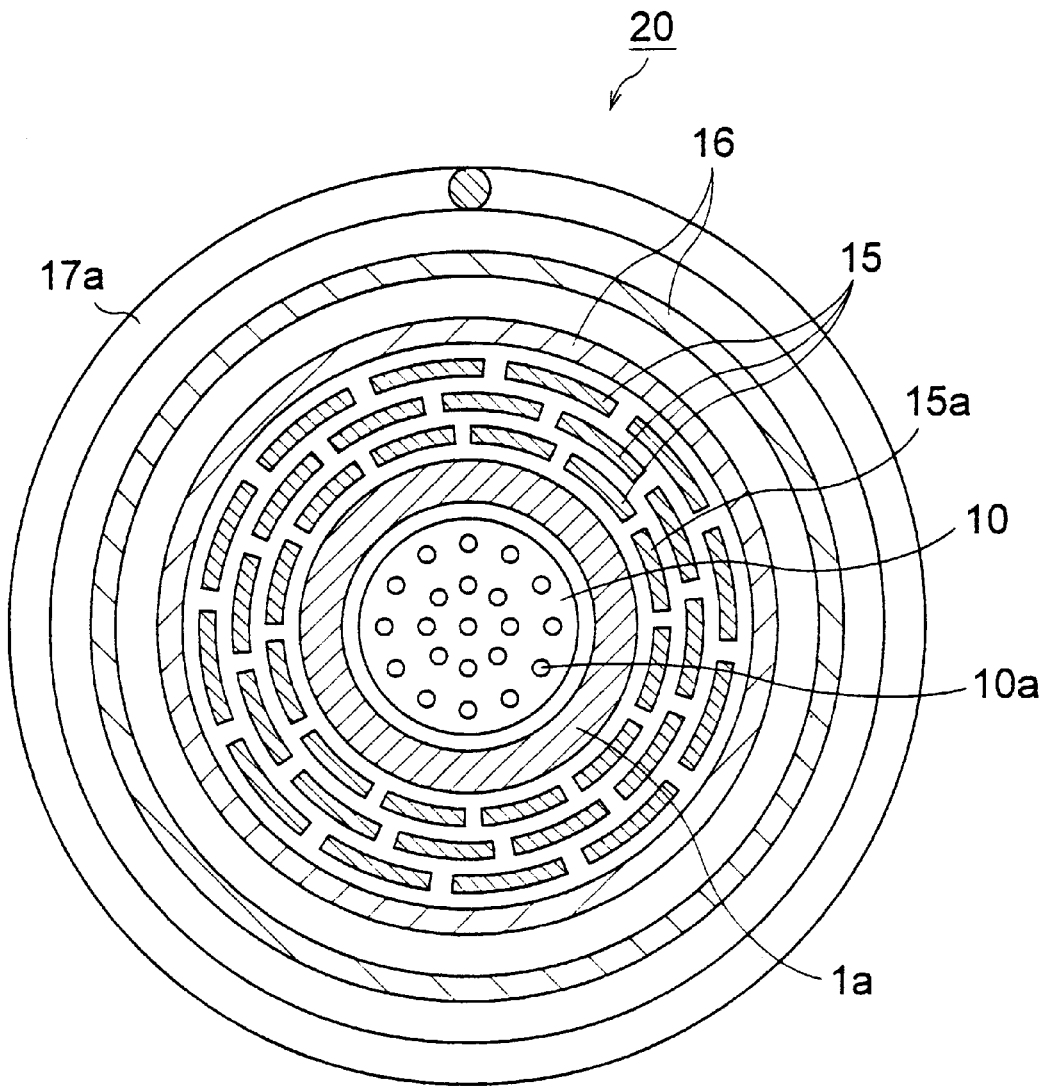
FIG. 2 is a sectional view of the apparatus for making a GaN single crystal shown in FIG. 1 taken along the II—II direction.

FIG. 1 is a view showing an apparatus 20 for making a GaN single crystal in accordance with this embodiment, whereas FIG. 2 is a sectional view of the apparatus 20 shown in FIG. 1 taken along the II—II direction.

In this apparatus 20, a hot wall 1, which is a cylindrical synthesis vessel made of graphite, is constituted by an upper hot wall 1a and a lower hot wall 1b each having a cylindrical form. The upper end of the upper hot wall 1a is closed with a disk-shaped lid 2. On the other hand, the lower hot wall 1b has a double structure in which two cylinders radially align with each other with a slight gap therebetween. Each of the inner peripheral faces of the upper hot wall 1a and lower hot wall 1b is formed from diamond-like carbon or glass-like carbon (glassy carbon) having a high smoothness. Preferably, the inner peripheral faces of the upper hot wall 1a and lower hot wall 1b have a surface roughness of $R_{max} < 10$ µm.

Inside the lower hot wall 1b, a Ga-accommodating crucible (Ga-disposing section) 3, having a bottomed cylinder form made of graphite, is inserted so as to be axially movable with a gap from the lower hot wall 1b. The lower part of the Ga-accommodating crucible 3 is fixedly attached to the upper face of a disk-shaped crucible support 4 which is slidable along the inner peripheral face of the lower hot wall 1b, whereas a cylindrical support shaft 5 connected to a not-illustrated drive source is fixedly attached to the center part of the lower face of crucible support 4. Namely, as the support shaft 5 moves up and down, the Ga-accommodating crucible 3 can move axially. Also, since the support shaft 5 has a hollow cylindrical form, the temperature of the bottom face of the crucible 3 can be measured with a two-temperature pyrometer.

The center parts of the support shaft 5, crucible support 4, and crucible 3 are provided with an Ar gas supply pipe 6 for supplying an Ar gas as a carrier gas. Here, as the carrier gas, a nitrogen gas may be used in place of the Ar gas. Also, the outer periphery of the crucible support 4 is provided with a plurality of ammonia supply holes 7 for supplying an ammonia gas as a gas containing a nitrogen atom, which axially penetrate therethrough.

Within the crucible 3, a solid Ga source 8 is accommodated. (Here, Ga source 8 may also be liquid.) On the upper face of the Ga source 8, a disk-shaped shield 9, made of carbon, a high-melting metal, quartz, or GaN, for regulating Ga vapor pressure is mounted. The shield 9 for regulating Ga vapor pressure is formed with a plurality of passage holes 9a axially penetrating therethrough so as to allow Ga vapor to pass therethrough. This shield 9 is used for regulating the area of the boundary between Ga in the melted liquid phase and Ga in the vapor phase, in order to control the vapor pressure from the Ga source 8.

To the upper part of the crucible 3, a disk-shaped control plate 10 for uniformly supplying Ga vapor is fixedly attached. This control plate 10 is made of the same material as the shield 9, such that the upper end of a cylinder vertically disposed on the crucible 3 is provided with a disk, which is formed with a plurality of passage holes 10a axially penetrating therethrough.

On the other hand, into the hot wall 1 at the upper part thereof, a cylindrical substrate-holder-supporting rod 11 penetrating through the center part of the lid 2 is inserted so as to be axially movable. To the lower end of the substrate-holder-supporting rod 11, a disk-shaped substrate holder (seed-crystal-disposing section) 12 is fixedly attached such as to close the lower end opening thereof. To the lower face of the substrate holder 12, a substrate 13 of GaN, which is a seed crystal, is fixedly attached with a paste made of glucose which has been melted at a high temperature or with a sol-gel of $SiO_2$ type. Since the support-holding rod 11 has a hollow cylindrical form, the temperature of the substrate 13 can be measured with a two-temperature pyrometer. Also, the substrate-holding rod 11 is disposed such as to be axially rotatable at a speed as high as 1500 rpm. The outer periphery of the lid 2 is provided with a plurality of gas exhaust holes 14, axially penetrating therethrough, for exhausting gases.

Outside the hot wall 1, as shown in FIG. 2, three pieces of heat shields 15 are disposed concentrically, aligning in radial directions of the hot wall 1. Each heat shield 15 is formed by a plurality of rectangular (strip-shaped) graphite sheets 15a disposed close to each other with a gap therebetween, such as to yield substantially a cylindrical form as a whole, whereas the neighboring heat shields 15 are disposed such that their gaps would not overlap radially. Since the heat shields 15 are not formed from carbon fiber or porous graphite which is often used in general and causes impurity contamination, there is no fear of impurity contamination.

Outside the outermost heat shield 15, a cylindrical quartz tube 16 made of quartz is disposed concentrically with the heat shields 15. A coolant such as water is allowed to flow through the quartz tube 16, thus protecting the latter. Outside the quartz tube 16, RF work coils 17a, 17b, which function as heating means, are successively disposed from the upper side so as to enable high-frequency heating of the hot wall 1 and the like. Also, a control section 18 for effecting temperature adjustment of the work coils 17a, 17b is connected thereto.

Here, the hot wall 1, heat shields 15, and so forth are configured such as to be able to attain a vacuum state as a whole within the range surrounded by the inner wall of the quartz tube 16.

In thus configured apparatus 20, according to the command of the control section 18, heating control can be effected such that the temperature of the Ga source 8 is set to 600° C. to 800° C. by the work coil 17 band the temperature of the substrate 13 is set to 900° C. to 1100° C. by the work coil 17a. Namely, this apparatus 20 is configured such that two areas consisting of a low-temperature area (first temperature area) $T_1$ for the Ga source 8 and a high-temperature area (second temperature area) $T_2$ for the substrate 13 can be formed within the hot wall 1.

With reference to FIG. 1, a method of making a GaN single crystal by using thus configured apparatus 20 for making a GaN single crystal will now be explained.

First, after the Ga source 8, the substrate 13 of GaN single crystal, and the like were set to their predetermined positions, the substrate-holder-supporting rod 11 was moved up to lift the substrate 13, the Ga source 8 was moved down together with the crucible 3, and then evacuation was effected for an hour in the space formed inside the inner wall of the quartz tube 16. Subsequently, an Ar gas was caused to flow into the apparatus 20 such as to yield a normal pressure (760 Torr) and, with a coolant flowing through the quartz tube 16, the hot wall 1 was set to 1500° C. and baked for an hour, so as to effect degassing.

Subsequently, the Ga source 8 was moved up together with the crucible 3 so as to attain the state shown in FIG. 1, the substrate-holder-supporting rod 11 and the substrate 13 were moved down to their predetermined positions, and then, with the substrate-holder-supporting rod 11 being rotated at 1000 rpm, the control section 18 was operated to adjust the work coils 17a, 17b such that the substrate 13 and the Ga source 8 attained temperatures of about 1100° C. and about 800° C., respectively. As the temperature setting is effected at such a normal pressure, crystals with inferior crystallinity can be prevented from growing.

Thereafter, the pressure inside the inner wall of the quartz tube 16 was lowered to 5 Torr in the Ar gas atmosphere and, with this state being maintained, the Ar gas as the carrier gas was caused to flow from the Ar gas supply pipe 6, thereby causing Ga vapor to pass through the passage holes 9a of the shield 9 and further through the passage holes 10a of the control plate 10. Subsequently, the Ga vapor was reacted with ammonia supplied from the ammonia supply holes 7 in the vicinity of the substrate 13. Then, the resulting GaN-forming gas was caused to reach the substrate 13, so as to grow a GaN single crystal on the surface of the substrate 13 at a rate of 100 μm/h, whereby an epitaxial film of GaN single crystal having a diameter of 2 inches and a thickness of 0.5 mm was finally formed.

In this embodiment, by adjusting the amount of ammonia supplied from the ammonia supply holes 7, the partial pressure of evaporated Ga determined by the heating temperature of the work coil 17b and the partial pressure of nitrogen contained in ammonia can be made substantially identical to each other. As a consequence, a high-quality GaN single crystal can be obtained.

Further, since the inner peripheral surfaces of the upper hot wall 1a and lower hot wall 2b are formed from amorphous carbon as mentioned above, they can restrain natural nucleation from occurring in the inner face of the hot wall 1, whereby a high-quality GaN single crystal can be formed.

Also, since a solid source of Ga is used, the partial pressure of hydrogen within the hot wall 1 decreases, whereby there is substantially no problem of the GaN single crystal being etched. Further, since no unstable organic metal is used as the Ga source, there would be no problems of particles caused by decomposition of the organic metal in the vapor phase. As a consequence, a sufficient amount of Ga can be supplied, so as to enable high-speed growth, and the GaN single crystal can be prevented from degrading due to the particles.

As the flow rate of the carrier gas transporting the evaporated Ga to the substrate is appropriately adjusted, the transportation of Ga to the substrate can be accelerated, whereby the growth rate can be enhanced. Though greatly depending on the temperature of Ga, the flow rate of the carrier gas is preferably within the range of about 0.5 to 20 SLM. Ga may not sufficiently be supplied when the flow rate is too low, whereas droplets of Ga may be formed when the flow rate is too high. When the balance in supply of elements is adjusted, stoichiometry can be regulated.

Since the heat shields 15 made of graphite are disposed outside the hot wall 1, the heat dissipation caused by heat radiation can be suppressed. Further, since the heat shield 15 comprises a plurality of graphite sheets 15a disposed with a gap therebetween, so as to yield substantially a cylindrical form as a whole, it can suppress the induced current caused by high-frequency heating. Also, since a plurality of such heat shields 15 are disposed radially of the hot wall 1, the heat dissipation and induced current can further be suppressed.

Also, Ga, ammonia, and the like can be made of highly pure materials which are inexpensively available, and can greatly reduce the concentration of impurities in the epitaxially grown film. Further, since the substrate-holder-supporting rod 11 and the substrate 13 are rotated at 100 rpm or over, the film thickness distribution can be made uniform, so as to allow the in-plane homogeneity to enhance, and diffusion can be accelerated, so as to raise the growth rate.

When investigating the optical characteristic of thus obtained epitaxial film, a sharp band edge absorption was observed. Also, upon Hall measurement, its electric characteristics revealed that n-type conduction had been formed. Further, when the substrate on the rear side was shaved of f so as to investigate the light transmissibility of this epitaxial film, it was found to be favorable at a wavelength of 2 to 5

μm, thus indicating this epitaxial film to be a good crystal which did not take a large amount of impurities therein.

Though the invention attained by the inventors is explained in detail with reference to the above-mentioned embodiment in the foregoing, the present invention should not be restricted to the above-mentioned embodiment. For example, as the means for heating the synthesis vessel such as crucible, resistance heating or the like may be used in place of the RF work coils.

As explained in the foregoing, in the method of making a GaN single crystal and apparatus for making a GaN single crystal in accordance with the present invention, the partial pressure of Ga can be adjusted by regulating the temperature of the first temperature area $T_1$, and the partial pressure of nitrogen can be made substantially identical to that of Ga by regulating the amount of supply of the nitrogen-containing gas, whereby a GaN single crystal substrate having a high quality can be obtained.

In the present invention, by using a liquid or a solid source of Ga, the partial pressure of hydrogen in the atmosphere decreases, whereby there is no problem of the GaN single crystal GaN being etched. Also, since no organic metal is used as the Ga source, the carbon concentration in the film can be lowered. Further, since no unstable organic metal is used, there would be no problem of particles caused by decomposition of the organic metal in the vapor phase. As a consequence, a sufficient Ga source can be supplied, whereby GaN is allowed to grow at a high speed.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method of making a single crystal GaN comprising:
   a disposing step of, in a gas containing a nitrogen atom, disposing Ga in a first temperature area $T_1$ and disposing a seed crystal of GaN in a second temperature area $T_2$ that is higher than said first temperature area $T_1$;
   a Ga-evaporating step of evaporating said Ga from said first temperature area $T_1$;
   a GaN-forming-gas-generating step of generating a GaN-forming gas by reacting said evaporated Ga and a nitrogen component in said nitrogen-containing gas; and
   a single-crystal-forming step of causing said GaN-forming gas to reach said seed crystal so as to form said GaN single crystal.

2. A method of making a GaN single crystal according to claim 1, wherein:
   a shield made of a member selected from the group consisting of carbon, a high-melting metal, quartz, and GaN is disposed at a boundary between Ga in a liquid phase and Ga in a vapor phase in said first temperature area $T_1$,
   said shield controlling the vapor pressure of Ga.

3. A method of making a GaN single crystal according to claim 1, wherein said seed crystal is rotated at 100 rpm or over in said single-crystal-forming step.

4. A method of making a GaN single crystal according to claim 1, wherein an argon gas or a nitrogen gas is used as a carrier gas of the Ga evaporated from said first temperature area $T_1$.

5. A GaN single crystal substrate made by the method of making a GaN single crystal according to claim 1.

6. An apparatus for making a GaN single crystal comprising:
   a Ga-disposing section in which Ga is disposed;
   a seed-crystal-disposing section in which a seed crystal of GaN is disposed;
   a synthesis vessel adapted to accommodate said Ga-disposing section, said seed-crystal-disposing section, and a gas containing nitrogen;
   heating means adapted to heat said Ga-disposing section and said seed-crystal-disposing section; and
   a control section for transmitting to said heating means a command for heating said Ga to an evaporation temperature of Ga or higher and heating said seed crystal to a temperature higher than that of said Ga,
   wherein said Ga evaporated by said heating means is adapted to react with the nitrogen of a nitrogen component in said gas so as to yield a GaN-forming gas, said GaN-forming gas being adapted to reach said seed-crystal-disposing section.

7. An apparatus for making a GaN single crystal according to claim 6, wherein an inner face of said synthesis vessel is formed from amorphous carbon.

8. An apparatus for making a GaN single crystal according to claim 6, wherein a heat shield made of graphite is disposed outside said synthesis vessel.

9. An apparatus for making a GaN single crystal according to claim 8, wherein said heat shield is made of a plurality of rectangular graphite sheets disposed close to each other with a gap therebetween, such as to yield substantially a cylindrical form as a whole.

10. An apparatus for making a GaN single crystal according to claim 8, wherein a plurality of said heat shields are disposed radially of said synthesis vessel.

* * * * *